(12) United States Patent
Kumata

(10) Patent No.: US 7,636,001 B2
(45) Date of Patent: Dec. 22, 2009

(54) DIGITAL DLL CIRCUIT

(75) Inventor: Ichiro Kumata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/707,984

(22) Filed: Feb. 20, 2007

(65) Prior Publication Data
US 2007/0194824 A1    Aug. 23, 2007

(30) Foreign Application Priority Data
Feb. 21, 2006    (JP) ............................. 2006-043962

(51) Int. Cl.
*H03L 7/06*    (2006.01)
(52) U.S. Cl. ..................... 327/158; 327/149; 327/152; 327/153; 327/161
(58) Field of Classification Search ................. 327/158, 327/161
See application file for complete search history.

(56) References Cited

U.S. PATENT DOCUMENTS

| 6,087,868 A * | 7/2000 | Millar ......................... 327/156 |
| 2003/0012320 A1 * | 1/2003 | Bell ............................. 375/376 |

FOREIGN PATENT DOCUMENTS

| JP | 07-095022 A | 4/1995 |
| JP | 11-273252 A | 10/1999 |
| JP | 2002-076859 A | 3/2002 |
| JP | 2004-531981 | 10/2004 |
| JP | 2005-142859 | 6/2005 |
| JP | 2005-168029 A | 6/2005 |

OTHER PUBLICATIONS

Marcovitz, Alan; Introduction to Logic Design; 2005; McGraw Hill; Second Edition; p. 368.*

* cited by examiner

*Primary Examiner*—Lincoln Donovan
*Assistant Examiner*—John W Poos
(74) *Attorney, Agent, or Firm*—Rader, Fishman & Grauer PLLC

(57) ABSTRACT

A digital DLL circuit includes: a first register configured to hold a first delay specifying value to specify a delay of a rising edge side of a signal; a second register configured to hold a second delay specifying value to specify a delay of a falling edge side of a signal; and a digitally-controlled variable delay circuit configured to be allowed to individually control delays of a rise side and a fall side of a signal. The digital DLL circuit further includes a control circuit configured to implement control so that a rise-side delay and a fall-side delay by the variable delay circuit are kept at the first delay specifying value of the first register and the second delay specifying value of the second register, respectively.

3 Claims, 12 Drawing Sheets

F I G. 5 A  IN (INPUT)
F I G. 5 B  S131B (D0_R OUTPUT)
F I G. 5 C  S132B (D0_F OUTPUT)
F I G. 5 D  S133B (SR_FF S INPUT)
F I G. 5 E  S134B (SR_FF R INPUT)
F I G. 5 F  DOUT (DELAYED OUTPUT)

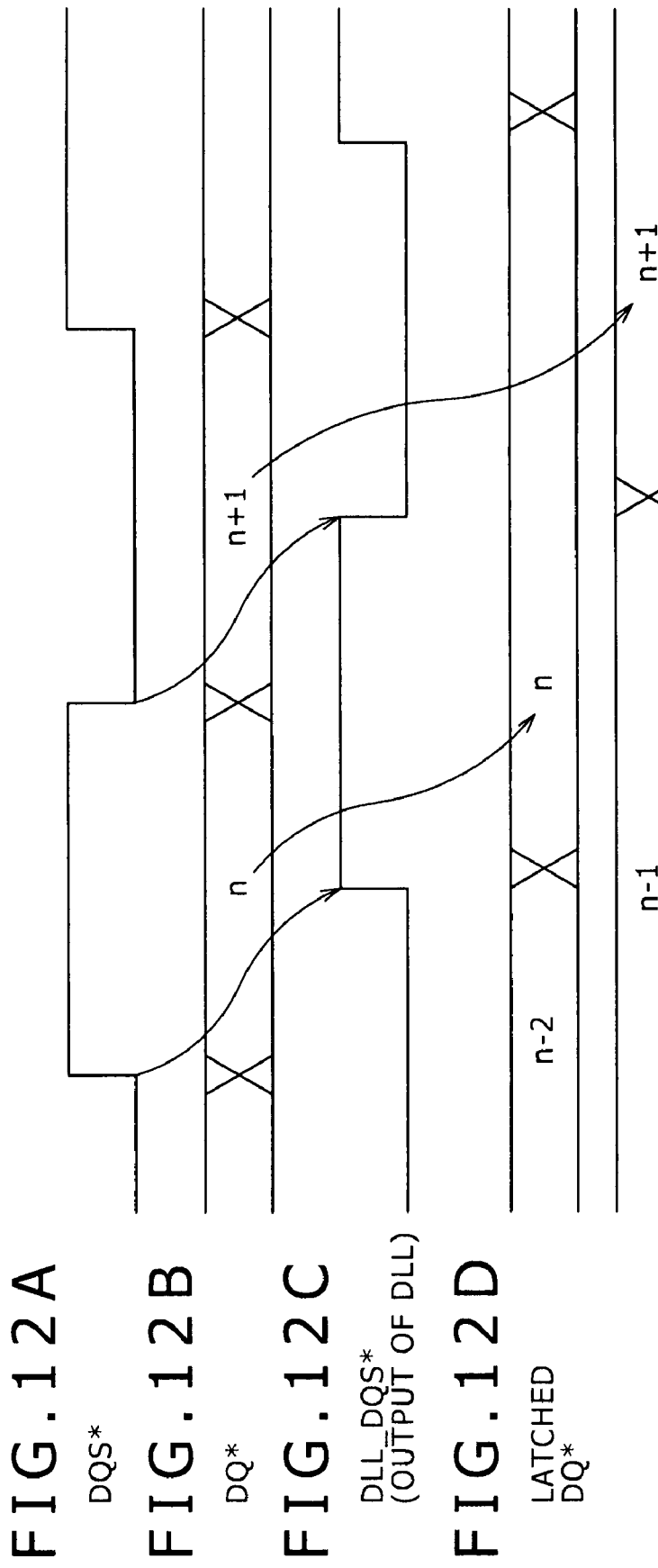

DIGITAL DLL CIRCUIT

CROSS REFERENCES TO RELATED APPLICATIONS

The present invention contains subject matter related to Japanese Patent Application JP 2006-043962 filed with the Japanese Patent Office on Feb. 21, 2006, the entire contents of which being incorporated herein by reference.

BACKGROUND OF THE INVENTION

1. Field of the Invention

The present invention relates to a digital delay locked loop (DLL) circuit that is applicable to an interface circuit for a memory such as a DRAM.

2. Description of the Related Art

The circuit delay inside an LSI fluctuates depending on the supply voltage, temperature, and variation in the process at the time of the fabrication.

The DLL circuit is used to suppress the fluctuation to thereby realize a desired stable delay.

The DLL is a technique to regulate, based on its circuit configuration, the amount of the delay (time difference) arising between a clock signal from outside of the chip and a clock signal inside the chip, and thereby realizing a short clock access time and a high operating frequency. The DLL circuit is used for, e.g., an interface circuit for a DRAM.

Various circuits have been proposed as this kind of DLL circuit; refer to, e.g., Japanese Patent Laid-open No. 2005-142859 (FIGS. 1 and 8) and JP-A-2004-531981 (FIGS. 1 and 3), hereinafter, referred to as Patent Document 1 and Patent Document 2, respectively.

In the DLL circuits disclosed in Patent Document 1 and Patent Document 2, feedback control for a variable delay circuit is carried out so that the variable delay circuit typically keeps a delay value that is predefined or specified by a register.

SUMMARY OF THE INVENTION

As described above, in existing DLL circuits, feedback control for a variable delay circuit is carried out so that the variable delay circuit typically keeps a delay value that is predefined or specified by a register.

However, such DLL circuits may not individually control the delays of the rise side and fall side of a signal.

Therefore, an error in the duty (the ratio of the High/Low pulse widths) of a clock and the difference in delay between the rise and fall of a data signal may not be compensated by the DLL.

There is a need for the present invention to provide a digital DLL circuit that can individually control the delays of the rise side and fall side of a signal, and thus compensate an error in the duty of a clock and the difference in delay between the rise and fall of a data signal.

According to one embodiment of the present invention, there is provided a digital DLL circuit that includes a first register configured to hold a first delay specifying value to specify the delay of the rising edge side of a signal and a second register configured to hold a second delay specifying value to specify the delay of the falling edge side of a signal. The digital DLL circuit further includes a digitally-controlled variable delay circuit configured to be allowed to individually control the delays of the rise side and fall side of a signal and a control circuit configured to implement control so that the rise-side delay and fall-side delay by the variable delay circuit are kept at the first delay specifying value of the first register and the second delay specifying value of the second register, respectively.

According to embodiments of the present invention, the delays of the rise side and fall side of a signal can be individually controlled, and thus an error in the duty of a clock and the difference in delay between the rise and fall of a data signal can be compensated.

BRIEF DESCRIPTION OF THE DRAWINGS

FIGS. 5A to 5F are a timing chart relating to the variable delay circuit of FIG. 4;

FIGS. 12A to 12D are a timing chart for explaining the operation of a DLL that functions as a DDR interface.

DETAILED DESCRIPTION OF THE PREFERRED EMBODIMENTS

Embodiments of the present invention will be described below in association with the accompanying drawings.

First Embodiment

Figure 1:
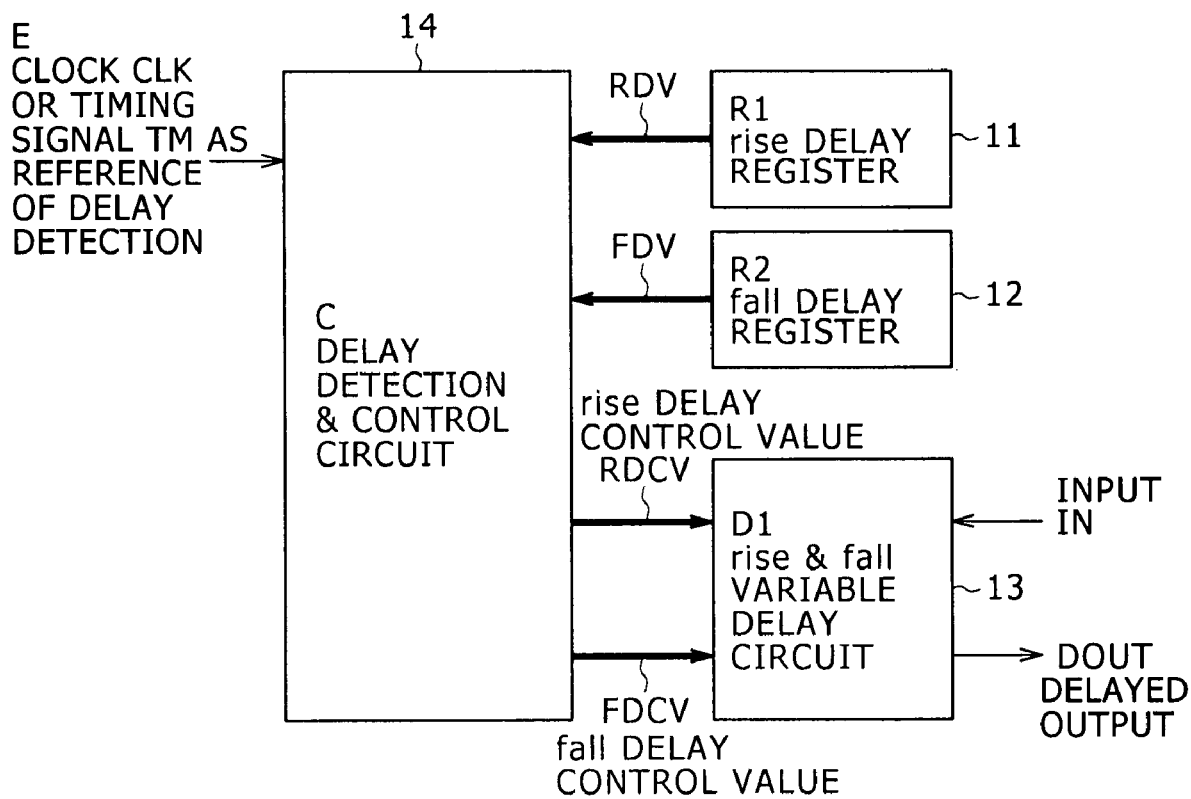
FIG. 1 is a block diagram showing a digital DLL circuit according to an embodiment of the present invention.

FIG. 1 is a block diagram showing a digital DLL circuit according to a first embodiment of the present invention.

The digital DLL circuit of the first embodiment can easily obtain a delay feedback value with a simple configuration including no PLL (phase comparison circuit), and can easily implement a complicated control. In addition, the digital DLL circuit can individually control the delays of the rise side and fall side of a signal, and thus can compensate an error in the duty of a clock and the difference in delay between the rise and fall of a data signal.

Referring to FIG. 1, a digital DLL circuit 10 includes a first register 11, a second register 12, a variable delay circuit 13, and a control circuit 14.

The first register 11 holds a first delay specifying value RDV to specify the delay of the rising edge side (Rise) of a signal.

The second register 12 holds a second delay specifying value FDV to specify the delay of the falling edge side (Fall) of a signal.

The variable delay circuit 13 is digitally controlled, and can individually control the delays of the rise side and fall side of a signal in accordance with a rise delay control value RDCV and a fall delay control value FDCV supplied from the control circuit 14.

Figure 2:
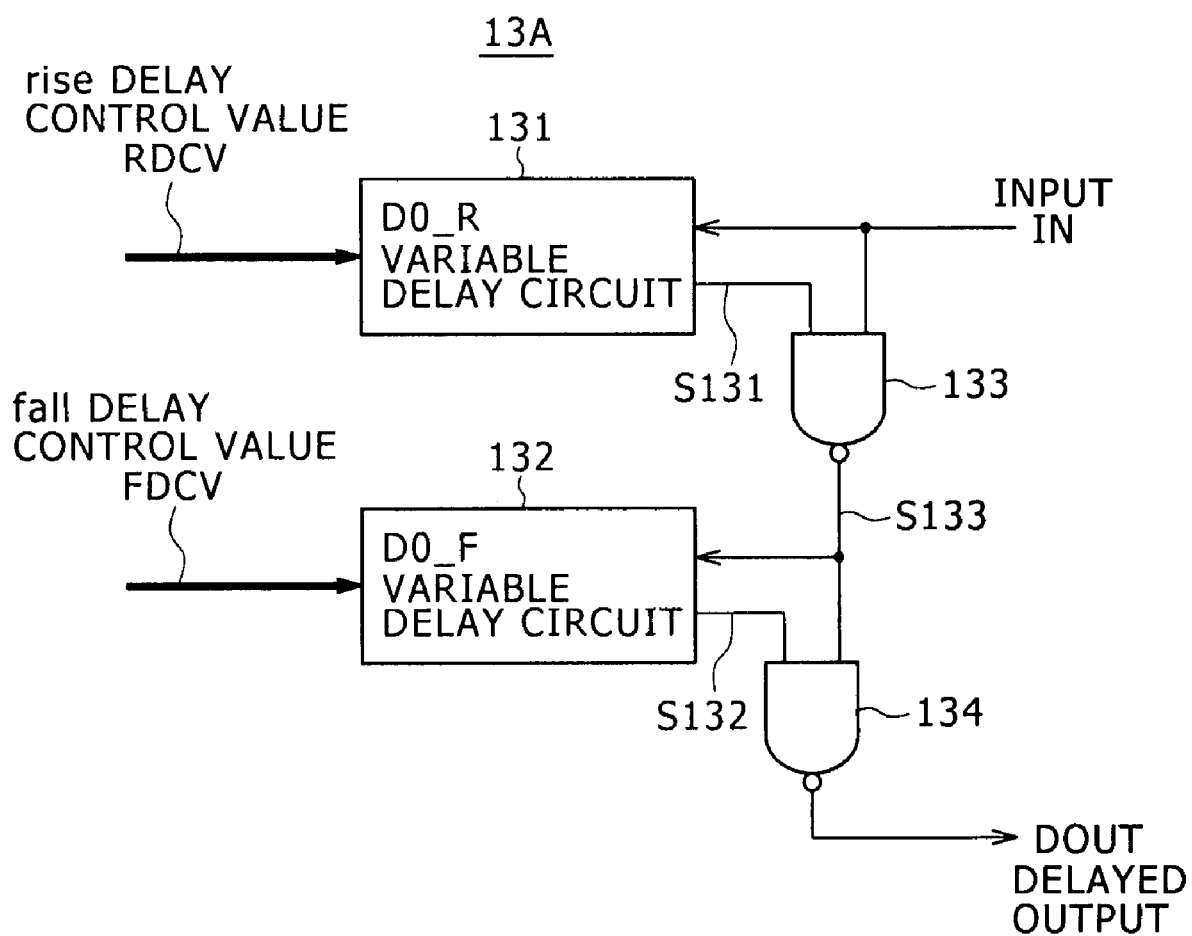
FIG. 2 is a circuit diagram showing a first configuration example of a variable delay circuit that can individually control the delays of the rise side and fall side of a signal according to the embodiment.
Figure 3:
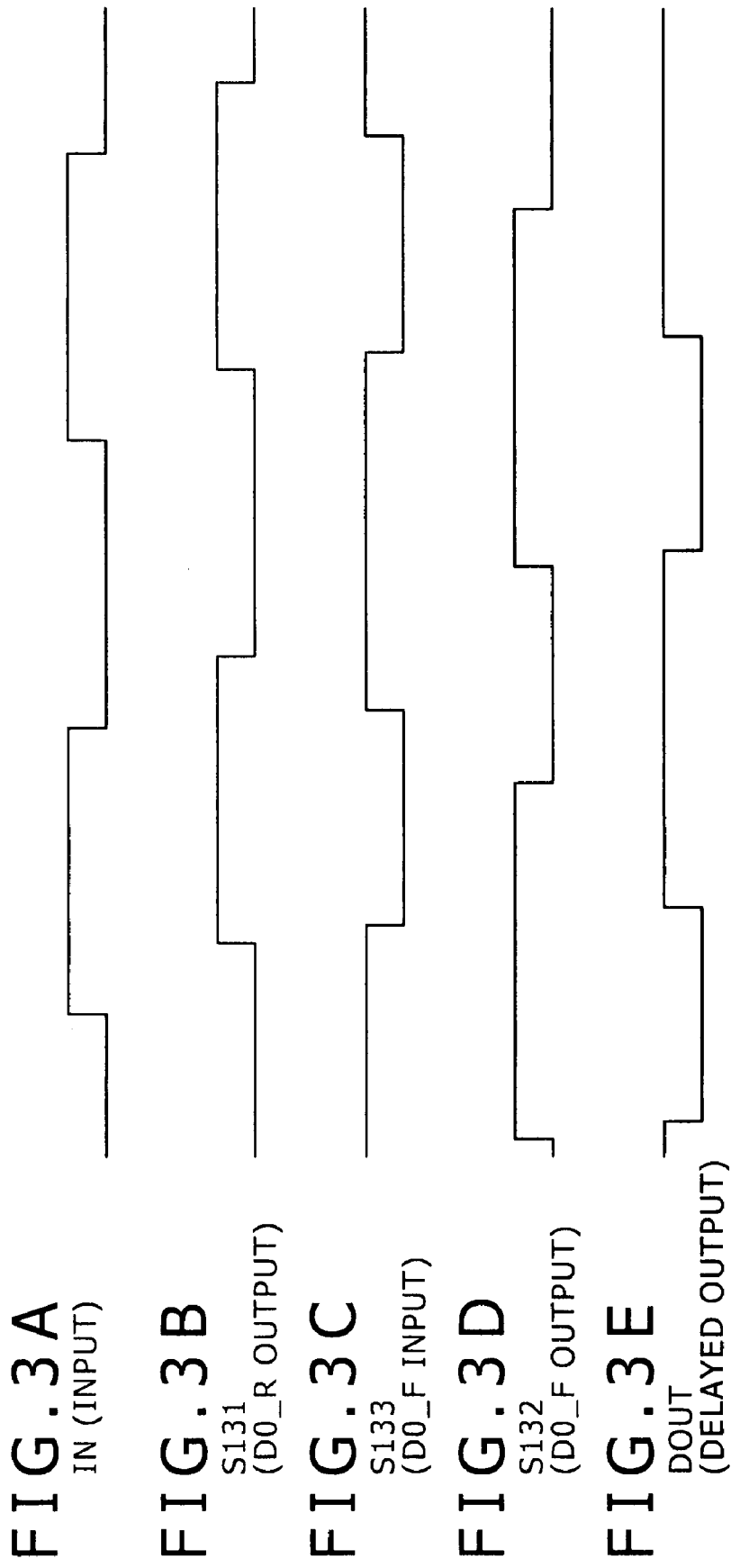
FIGS. 3A to 3E are a timing chart relating to the variable delay circuit of FIG. 2.

FIG. 2 is a circuit diagram showing a first configuration example of the variable delay circuit that can individually control the delays of the rise side and fall side of a signal according to the first embodiment.

FIGS. 3A to 3E are a timing chart relating to the variable delay circuit of FIG. 2.

A variable delay circuit 13A of FIG. 2 includes variable delay circuits 131 and 132, and NAND gates 133 and 134.

The variable delay circuit 131 delays an input signal (data) IN by the delay amount dependent upon the rise delay control value RDCV supplied from the control circuit 14, and outputs the delayed signal as a signal S131 to the NAND gate 133.

The NAND gate 133 performs a NAND operation on the signal S131 output from the variable delay circuit 131 and the input signal IN, and outputs the operation result as a signal S133 to the variable delay circuit 132 and the NAND gate 134.

The variable delay circuit 132 delays the signal S133 output from the NAND gate 133 by the delay amount dependent upon the fall delay control value FDCV supplied from the control circuit 14, and outputs the delayed signal as a signal S132 to the NAND gate 134.

The NAND gate 134 performs a NAND operation on the signal S132 output from the variable delay circuit 132 and the signal S133 output from the NAND gate 133, and outputs the operation result as a delayed output DOUT.

Figure 4:
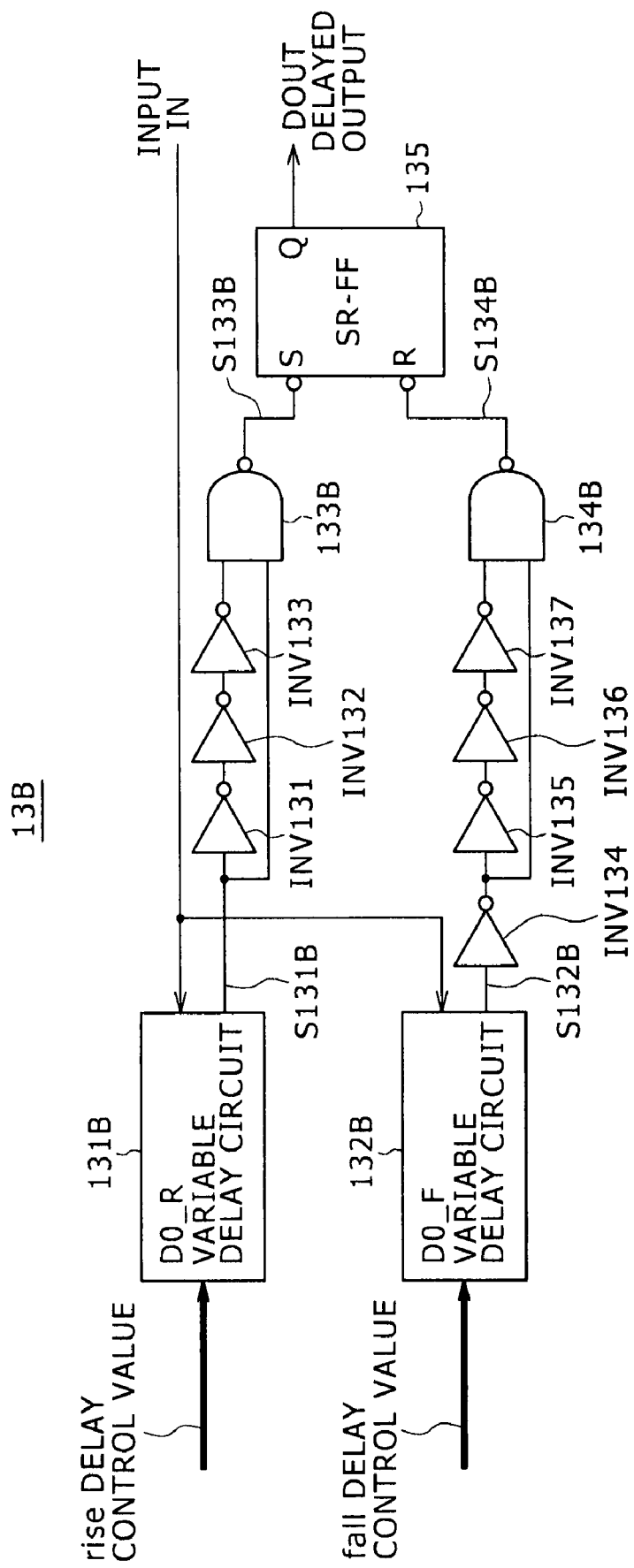
FIG. 4 is a circuit diagram showing a second configuration example of the variable delay circuit that can individually control the delays of the rise side and fall side of a signal according to the embodiment.

FIG. 4 is a circuit diagram showing a second configuration example of the variable delay circuit that can individually control the delays of the rise side and fall side of a signal according to the first embodiment.

FIGS. 5A to 5F are a timing chart relating to the variable delay circuit of FIG. 4.

A variable delay circuit 13B of FIG. 4 includes variable delay circuits 131B and 132B, NAND gates 133B and 134B, an SR flip-flop 135, and inverters INV131 to INV137.

The variable delay circuit 131B delays an input signal (data) IN by the delay amount dependent upon the rise delay control value RDCV supplied from the control circuit 14, and outputs the delayed signal as a signal S131B to the input terminals of the NAND gate 133B and the inverter INV131. The inverters INV132 and INV133 are connected in series to the output side of the inverter INV131.

The NAND gate 133B performs a NAND operation on the signal S131B output from the variable delay circuit 131B and the signal delayed by the inverters INV131 to INV133, and outputs the operation result as a pulse signal S133B to the S terminal of the flip-flop 135.

The variable delay circuit 132B delays the input signal (data) IN by the delay amount dependent upon the fall delay control value FDCV supplied from the control circuit 14, and outputs the delayed signal as a signal S132B to the input terminal of the inverter INV134.

The inverter INV134 inverts the signal S132B output from the variable delay circuit 132B so as to output the inverted signal to the input terminals of the NAND gate 134B and the inverter INV135. The inverters INV136 and INV137 are connected in series to the output side of the inverter INV135.

The NAND gate 134B performs a NAND operation on the signal obtained by inverting the signal S132B output from the variable delay circuit 132B by the inverter INV134 and the signal delayed by the inverters INV135 to INV137 and outputs the operation result as a pulse signal S134B to the R terminal of the flip-flop 135.

The SR flip-flop 135 outputs a delayed output DOUT of which rise and fall are controlled by the pulse S133B output from the NAND gate 133B and the pulse S134B output from the NAND gate 134B, respectively, from its Q terminal.

In these two examples, two variable delay circuits that each simultaneously delay the rise and fall of a signal by the same delay amount are employed for individual control of the delays. Specifically, waveforms are synthesized such that, due to the external gates, the delay by one variable delay circuit affects only the rise side and the delay by the other variable delay circuit affects only the fall side.

Figure 6:
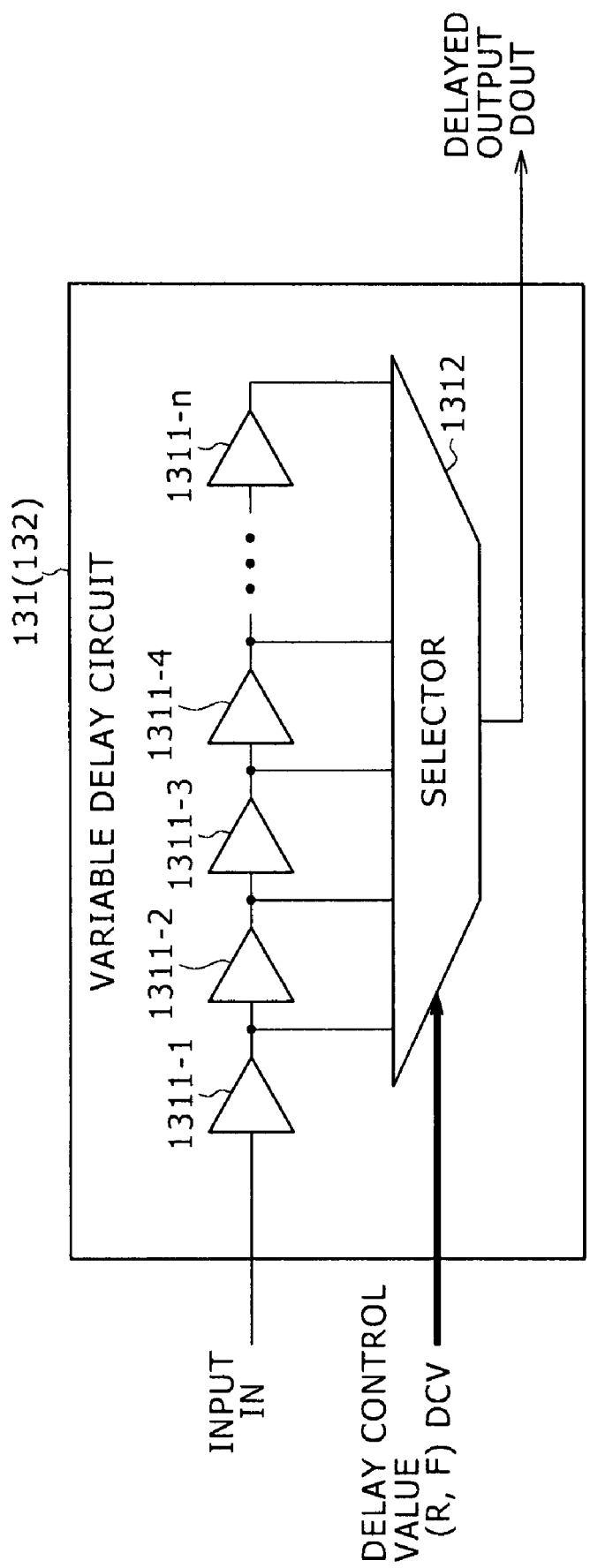
FIG. 6 is a diagram conceptually showing a configuration example of the variable delay circuits of FIGS. 2 and 4.

The variable delay circuits 131 and 132 of FIG. 2 and the variable delay circuits 131B and 132B of FIG. 4 have, e.g., the configuration shown in FIG. 6.

FIG. 6 is a diagram conceptually showing a configuration example of the variable delay circuits of FIGS. 2 and 4.

The variable delay circuit 131 (132, 131B, 132B) in FIG. 6 includes plural delay elements 1311-1 to 1311-$n$ that are cascaded to an input, and a selector 1312 that selects the output of either one of the delay elements 1311-1 to 1311-$n$ depending on the delay control value DCV supplied from the control circuit 14 to thereby obtain the delayed output DOUT.

The control circuit 14 implements control so that the rise-side delay and fall-side delay by the variable delay circuit 13 are kept at the first delay specifying value RDV of the first register 11 and the second delay specifying value FDV of the second register 12, respectively.

More specifically, the control circuit 14 receives the first and second delay specifying values RDV and FDV as delay target values from the first and second registers 11 and 12, and it is supplied with a clock CLK or timing signal TM serving as a reference of the delay detection. From the signal CLK or TM and the delay specifying values RDV and FDV as the delay target values, the control circuit 14 calculates the delay control values RDCV and FDCV of the rise side and fall side of a signal for the variable delay circuit 13, and supplies the calculated control values to the variable delay circuit 13.

To calculate the feedback control values inside the control circuit 14, as described above, the externally input reference clock CLK or reference timing signal TM is compared with the output of a ring oscillator or measurement-target delay circuit that is provided in the control circuit 14 to detect the chip temperature, supply voltage, and delay fluctuation due to process variation.

As another configuration, instead of including a ring oscillator or measurement-target delay circuit, the control circuit may compare a reference clock with input/output signals of the DLL circuit and the delay difference of the signals.

In the digital DLL circuit 10 of FIG. 1, the control circuit 14 reads out the first delay specifying value RDV that is held in the first register 11 and that is to specify the delay of the rising edge side (Rise) of a signal, and the second delay specifying value FDV that is held in the second register 12 and that is to specify the delay of the falling edge side (Fall) of a signal.

The control circuit 14 is supplied with the first and second delay specifying values RDV and FDV read out from the first and second registers 11 and 12, and the clock CLK or timing signal TM as a reference of the delay detection. From the signal CLK or TM and the delay specifying values RDV and FDV as delay target values, the control circuit 14 calculates the delay control values RDCV and FDCV of the rise side and fall side of a signal for the variable delay circuit 13, and supplies the calculated control values to the variable delay circuit 13.

The variable delay circuit 13 offers the delayed output DOUT that results from individual control of the delays of the rise side and fall side of a signal in accordance with the rise delay control value RDCV and the fall delay control value FDCV supplied from the control circuit 14.

As described above, according to the first embodiment, the digital DLL circuit 10 includes the first register 11 that holds a first delay specifying value to specify the delay of the rising edge side of a signal, and the second register 12 that holds a second delay specifying value to specify the delay of the falling edge side of a signal. The digital DLL circuit 10 further includes the digitally-controlled variable delay circuit 13 that can individually control the delays of the rise side and fall side of a signal, and the control circuit 14 that implements control so that the rise-side delay and fall-side delay by the variable delay circuit 13 are kept at the first delay specifying value of the first register 11 and the second delay specifying value of the second register 12, respectively. Thus, the delays of the rise side and fall side of a signal input to the DLL circuit can be individually controlled.

This feature allows the duty of a clock signal and the High/Low pulse widths of a data signal to be accurately corrected simultaneously with a normal DLL delay addition.

Second Embodiment

Figure 7:
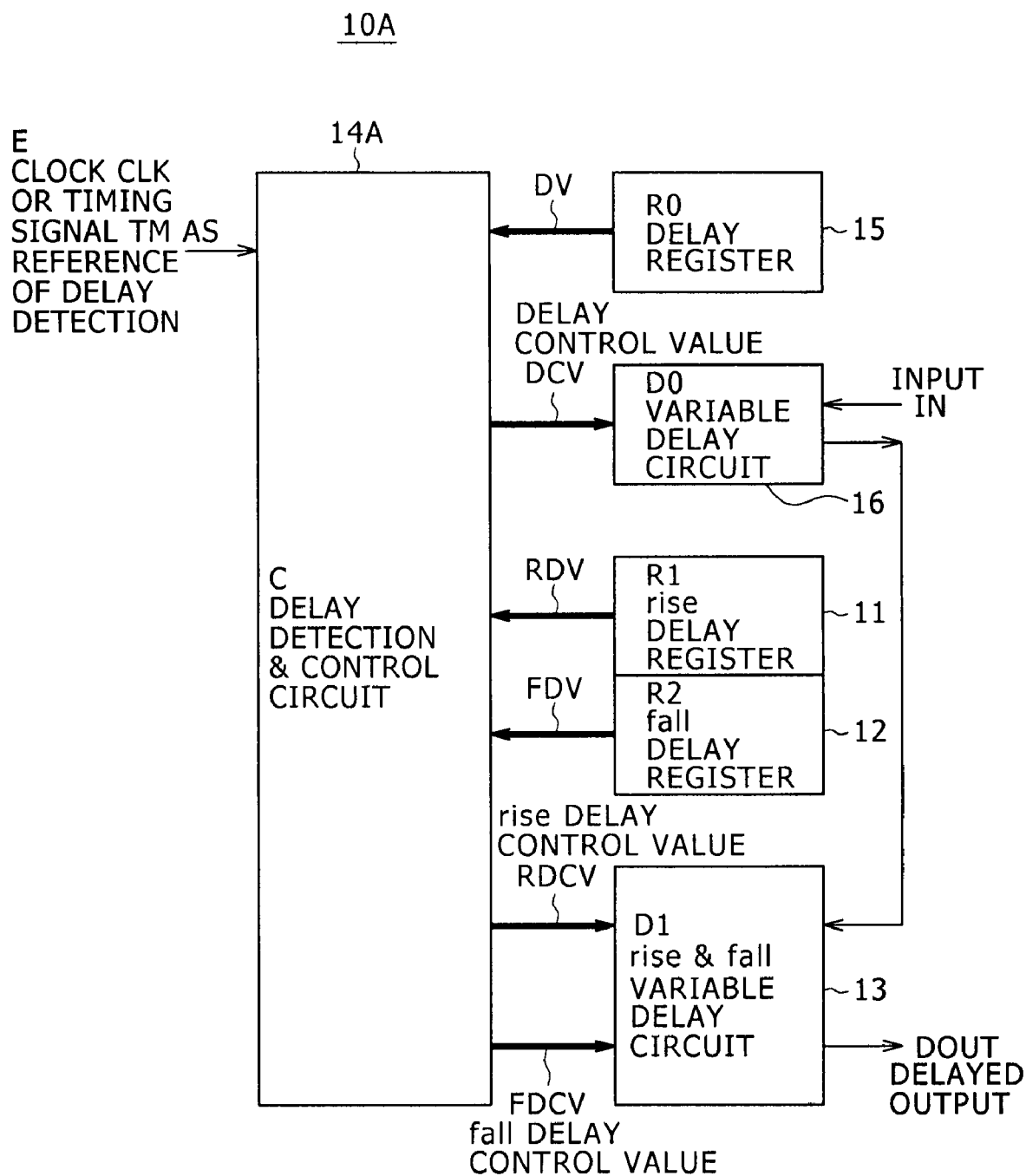
FIG. 7 is a block diagram showing a digital DLL circuit according to a second embodiment of the invention.

FIG. 7 is a block diagram showing a digital DLL circuit according to a second embodiment of the present invention.

The different points between a digital DLL circuit 10A of the second embodiment and the digital DLL circuit 10 of the first embodiment are as follows. In the digital DLL circuit 10A, a third register 15 that holds a delay target value DV and a digitally-controlled second variable delay circuit 16 are further included. Furthermore, a control circuit 14A has the following function in addition to the function of the control circuit 1A of the first embodiment. Specifically, the control circuit 14A performs a digital arithmetic operation based on the delay target value DV of the register and a clock CLK or timing signal TM as a reference of the delay detection, and supplies the second variable delay circuit 16 with the operation result as a delay control value DCV. The second variable delay circuit 16 is serially connected to the variable delay circuit 13 so that a delayed output from the second variable delay circuit 16 is input to the variable delay circuit 13.

The newly added variable delay circuit 16 can be formed of, e.g., a circuit that is similar to that of FIG. 6, common to the rise and fall of a signal.

The second embodiment employs a configuration in which a circuit that individually adjusts the rise and fall of a signal, as described in the first embodiment, is serially connected to a delay adjustment circuit part common to the rise and fall of a signal. Therefore, if the difference in the delay adjustment amount between the rise and fall of a signal is small, the circuit scale of the variable delay circuit can be reduced.

A description of a configuration example of the delay adjustment circuit part common to the rise and fall of a signal added in the second embodiment will be given below.

Figure 8:
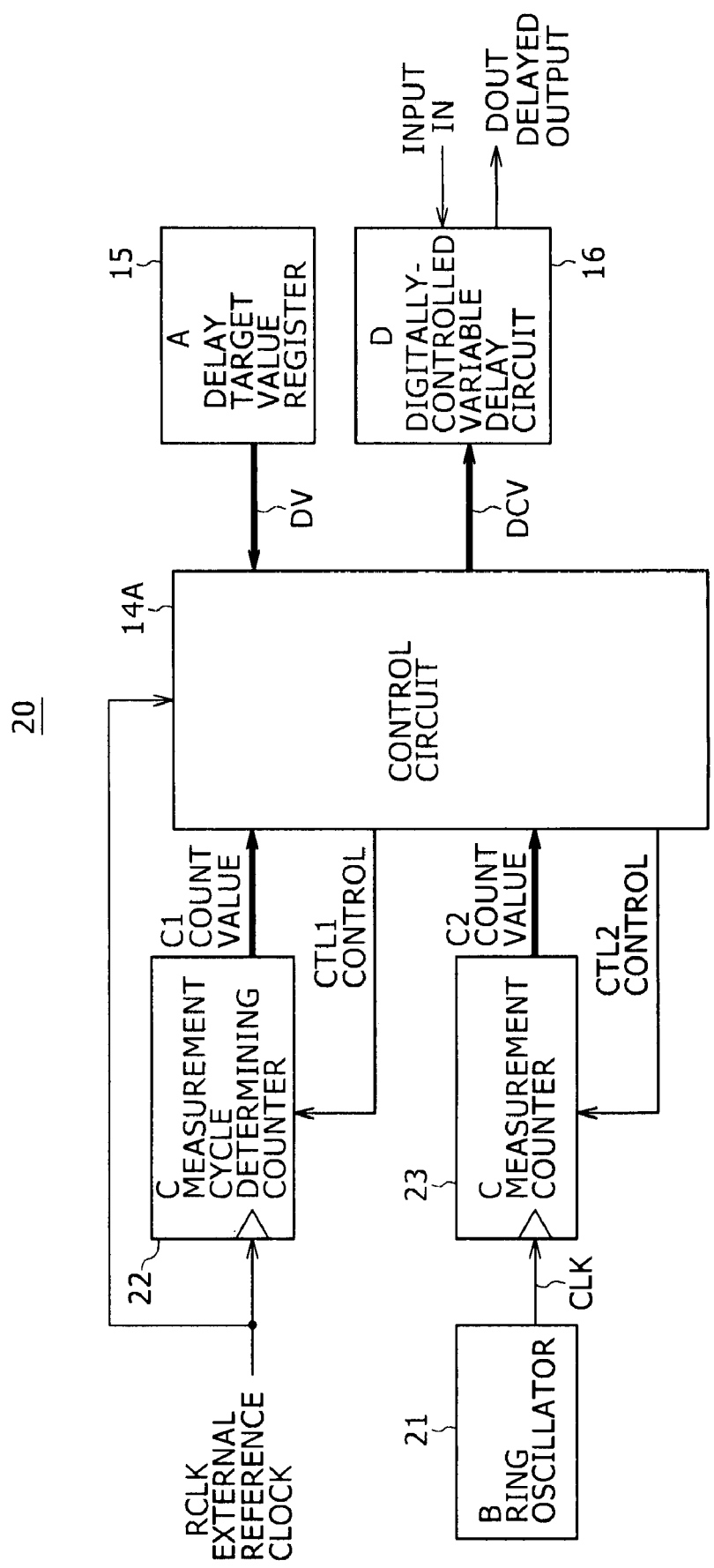
FIG. 8 is a diagram for explaining a specific configuration example of a delay adjustment circuit part common to the rise and fall of a signal according to the second embodiment.

FIG. 8 is a diagram for explaining a specific configuration example of the delay adjustment circuit part common to the rise and fall of a signal according to the second embodiment.

Note that the configuration of FIG. 8 is merely an example, and the present invention is not limited thereto.

Referring to FIG. 8, a delay adjustment circuit part 20 common to the rise and fall of a signal includes the control circuit 14A, the third register 15, the digitally-controlled variable delay circuit 16, a ring oscillator 21, a first counter 22, and a second counter 23.

The third register 15 holds a predefined delay target value.

The ring oscillator 21 generates a clock CLK of a predetermined frequency, and outputs the clock CLK to the second counter 23.

The first counter 22 counts a reference clock RCLK from the external of the IC in order to determine the measurement cycle, and outputs a count value C1 to the control circuit 14A.

The second counter 23 counts the clock CLK generated and output by the ring oscillator 21 in every measurement cycle determined by the first counter 22, and outputs a count value C2 to the control circuit 14A.

The digitally-controlled variable delay circuit 16 delays input data IN by the delay amount dependent upon the delay control value DCV supplied from the control circuit 14A, to thereby obtain a delayed output DOUT. This delayed output is supplied as an input to the variable delay circuit 13 of FIG. 7.

The control circuit 14A has the same function as that of the control circuit 14 of the first embodiment. In addition, based on the count value C1 of the first counter 22, the control circuit 14A controls the reset and activation of the first counter 22 and the second counter 23, and controls the stop of the counters 22 and 23 according to need, through control signals CTL1 and CTL2. Furthermore, the control circuit 14A subjects the count value C2 of the second counter 23 and the delay target value DV of the third register 15 to a digital arithmetic operation, and supplies the operation result as the delay control value DCV the variable delay circuit 16. The delay adjustment circuit part 20 (digital DLL circuit 10A) has the above-described configuration. If the ring oscillator and the variable delay circuit are disposed close to each other in the same LSI and the configurations of the delay gates in the ring oscillator and the variable delay circuit are made similar to each other, the influence on delay by the supply voltage and temperature inside the LSI and process variation determined at the time of the fabrication in the ring oscillator 21 is almost the same as that in the variable delay circuit 16.

Accordingly, the ratio between the oscillation cycle of the ring oscillator 21 and the delay amount of the variable delay circuit 16 is invariably almost constant.

Therefore, measuring the oscillation cycle of the ring oscillator 21 or the oscillation frequency thereof, which is the inverse number of the oscillation cycle, allows the delay value of the variable delay circuit 16 to be found through proportional calculation.

From the delay target value DV and the current delay value of the variable delay circuit 16, the delay control value (feedback amount) DCV to be supplied to the variable delay circuit 16 can be calculated.

In the delay adjustment circuit part 20, the first counter 22 and the second counter 23 are employed for the measurement of the oscillation cycle or oscillation frequency of the ring oscillator 21.

The operation of the delay adjustment circuit part 20 (digital DLL circuit 10A) according to the second embodiment will be described below, with a focus on the control operation of the control circuit 14A, in association with the flowchart of FIG. 9.

Upon the start of a measurement loop (ST10), the first counter 22 and the second counter 23 are initialized (reset) by the control signals CTL1 and CTL2 (ST11).

Subsequently, the first counter 22 starts the counting of the external reference clock RCLK, and the second counter 23 starts the counting of the clock CLK generated and output by the ring oscillator 21 (ST12).

Subsequently, whether or not the count value C1 of the first counter 22 has reached the maximum value (max) is determined (ST13). If Yes, the counting operation of the first counter 22 and the second counter 23 is stopped (ST14).

The count value C2 of the second counter 23 is then read out (ST15).

Subsequently, the process of calculating the delay control value (feedback amount) DCV is started (ST20), so that the delay target value DV of the register 15 and the second count value C2 are loaded in the control circuit 14A (ST21).

The loaded delay target value DV and the second count value C2 are subjected to a digital calculation so that the delay control value DCV of the variable delay circuit 16 is obtained (ST22), and this delay control value DCV is set in (supplied to) the variable delay circuit 16.

Figure 9:
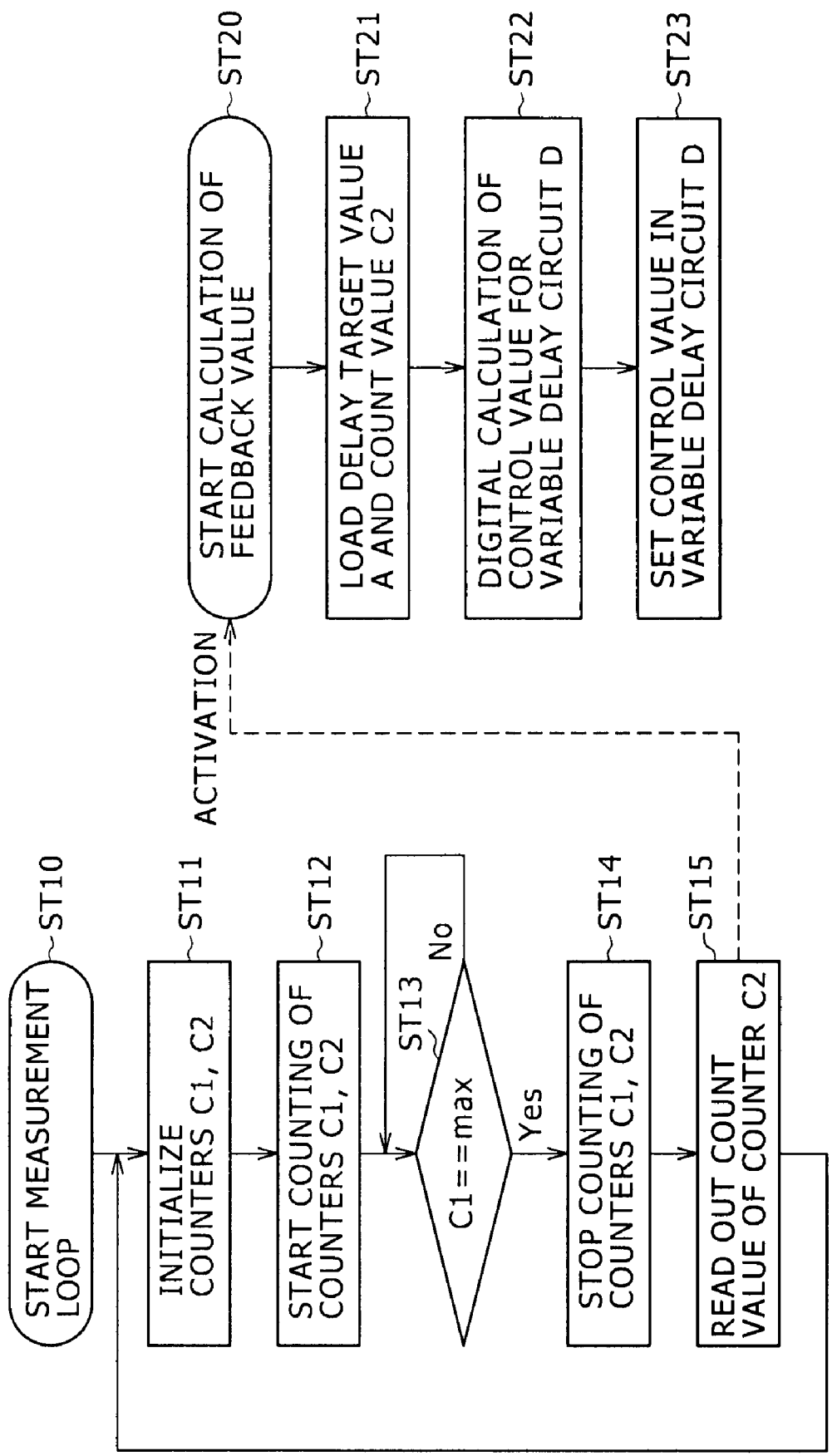
FIG. 9 is a flowchart for explaining the control operation of the circuit of FIG. 8.

If the measurement cycle is determined based on the count value C1 of the first counter 22 and the count value C2 of the second counter 23 in one measurement cycle is read out in accordance with the operation flow of FIG. 9, the ratio between the cycles or frequencies of the externally input reference clock RCLK and the clock CLK generated by the ring oscillator 21 can be found.

From the ratio and the cycle or frequency of the reference clock RCLK, the cycle or frequency of the clock CLK generated by the ring oscillator 21 can be obtained.

Furthermore, the ratio between the cycle of the clock CLK generated by the ring oscillator 21 and the delay of the variable delay circuit can be found through, e.g., a delay analysis at the time of the LSI design. Therefore, as a result, the delay of the variable delay circuit 16 can be obtained.

As described above, according to the second embodiment, the advantages by the first embodiment can be achieved. In addition, because the current delay value of the variable delay circuit 16 is compared with a delay target value and the control circuit 14A executes feedback through a digital arithmetic operation so that the delay value matches the delay target value, the delay of the variable delay circuit 16 is typically kept near the delay target value, which allows the digital DLL circuit 10A to function as a highly accurate DLL circuit.

That is, a delay feedback value can be easily obtained with a simple configuration including no phase comparison circuit and so on, and a complicated control can be easily implemented.

To enhance the accuracy of the delay control, the frequency of the clock used for the measurement is enhanced, or the period of one measurement is extended to increase the count value.

To increase the response speed, the clock frequency is enhanced with the accuracy being kept constant, or the accuracy is lowered with the clock frequency being kept the same.

Third Embodiment

Figure 10:
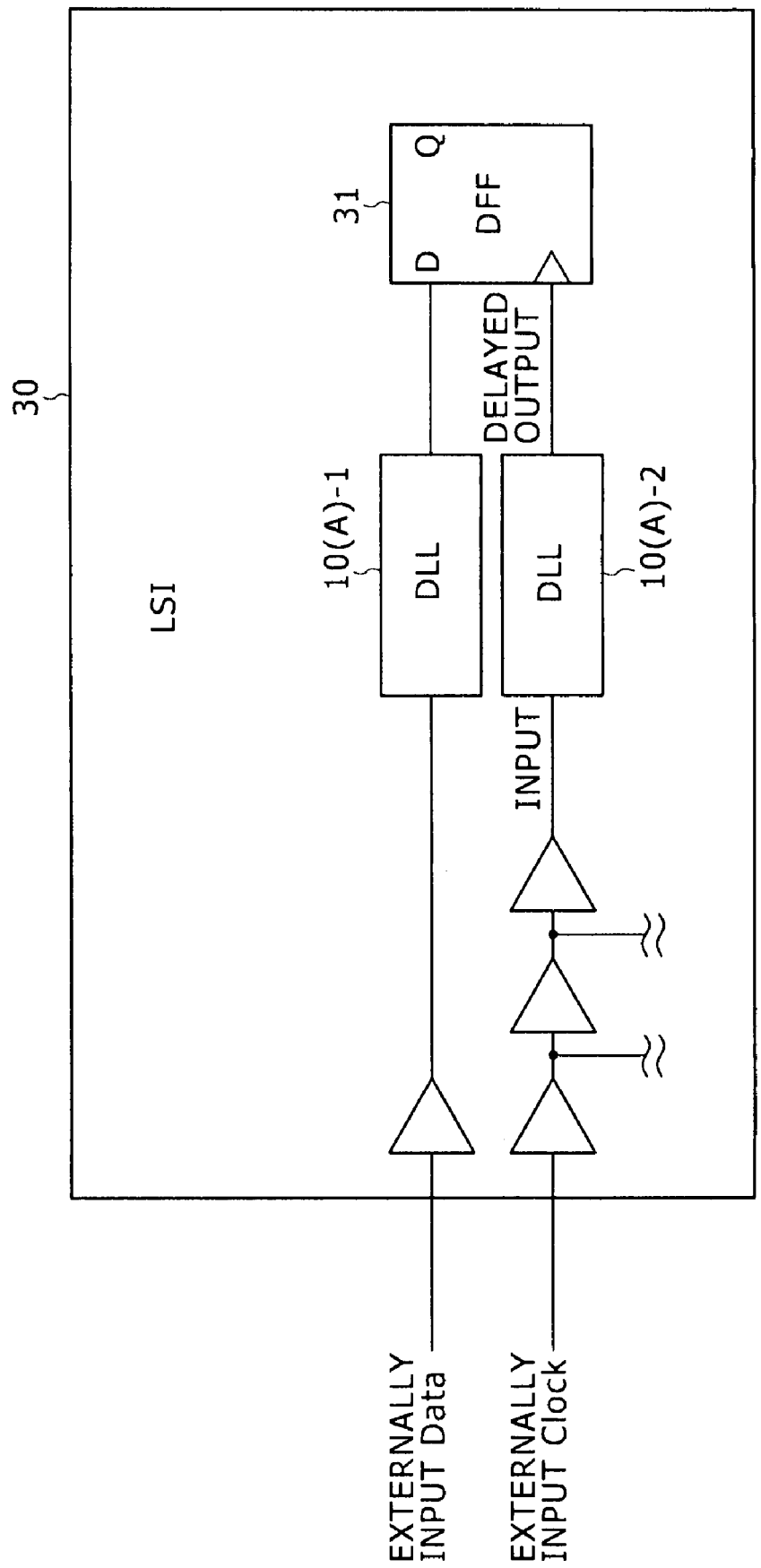
FIG. 10 is a diagram showing a configuration example in which the digital DLL circuits according to the respective embodiments of the invention are integrated in an LSI.

FIG. 10 is a diagram showing a configuration example according to a third embodiment of the present invention in which the digital DLL circuits according to the respective embodiments of the invention are integrated in an LSI.

In the third embodiment, the digital DLL circuit 10 or 10A of the first or second embodiment is disposed on each of a data input line and a clock input line inside an LSI 30. The output of the digital DLL circuit 10-1 on the data side is supplied to the D input of a flip-flop 31, and the output of the digital DLL circuit 10-2 on the clock side is input as a clock to the flip-flop 31.

Figure 11:
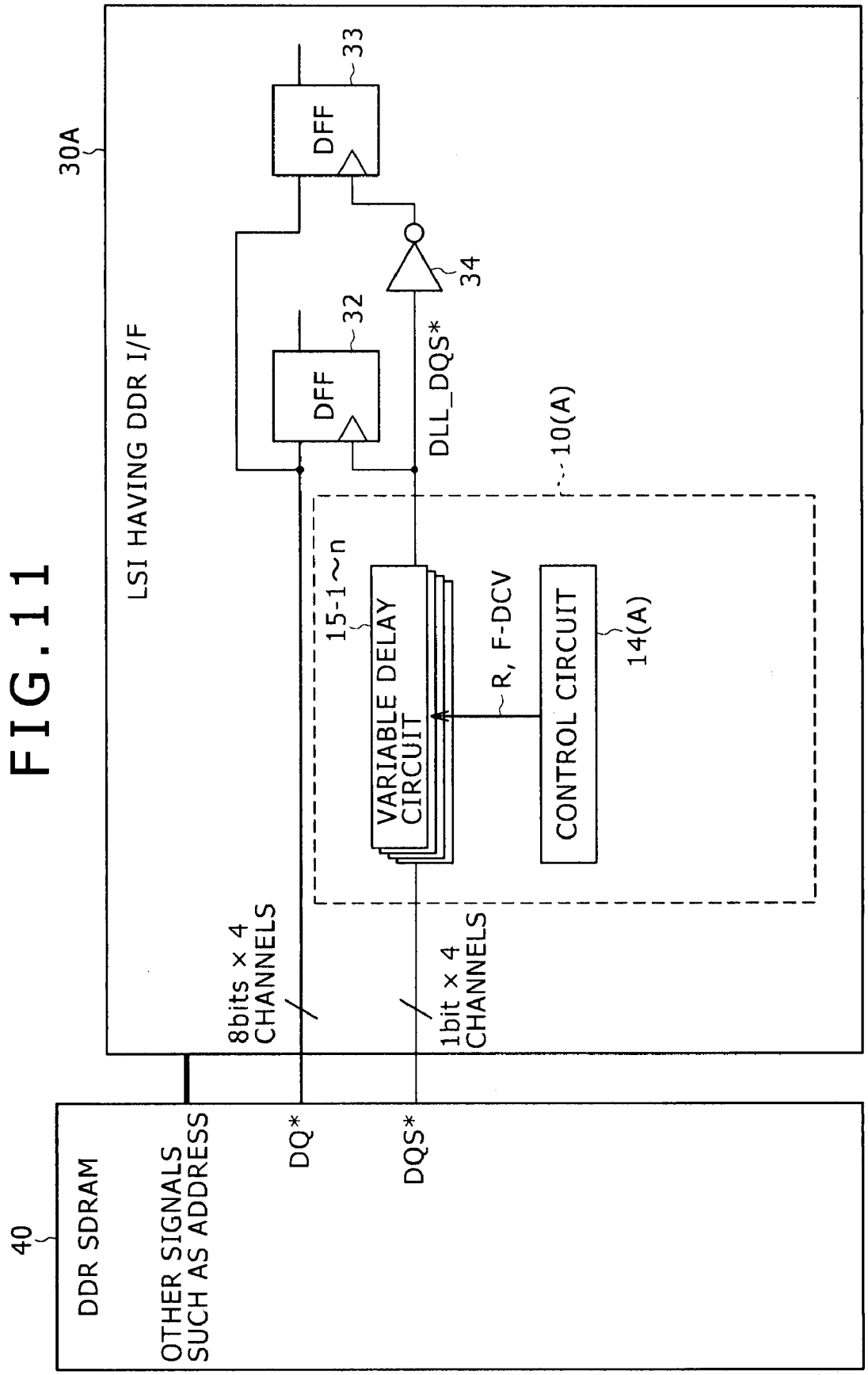
FIG. 11 is a diagram for explaining a DDR interface.

Furthermore, the digital DLL circuits 10 and 10A having the above-described features can be used as an interface circuit for a double data rate (DDR) DRAM like the one shown in FIG. 11, for example.

In FIG. 11, reference symbol 40 denotes a DDR synchronous DRAM (SDRAM), and symbol 30A denotes a certain LSI. Furthermore, symbols 32 and 33 denote D-type flip-flops, and symbol 34 denotes an inverter.

In FIG. 11, an illustration of a power supply system is omitted.

FIGS. 12A to 12D are a timing chart for explaining the operation of the DLL circuit that functions as a DDR interface.

When data is read out from the DDR SDRAM 40, a signal DQS* that indicates the timings of changes of read data DQ* is output for each certain group (e.g., for each 8 bits) of the read data DQ*.

To latch the read data inside the LSI 30A, it is necessary that the signal DQS* be delayed by the period about one-fourth the clock cycle, so as to be used as a load clock.

The digital DLL circuits 10 and 10A produce a stable delayed signal DQS for the latch.

In this manner, the digital DLL circuit can be applied as a DDR interface, and can produce a stable clock signal of which the delay oscillation is small.

It should be understood by those skilled in the art that various modifications, combinations, sub-combinations and alterations may occur depending on design requirements and other factors insofar as they are within the scope of the appended claims or the equivalents thereof.

What is claimed is:

1. A digital DLL circuit comprising:
    a first register configured to hold a first delay specifying value to specify a delay value of a rising edge side of a signal;
    a second register configured to hold a second delay specifying value to specify a delay value of a falling edge side of a signal;
    a digitally-controlled variable delay circuit configured to be allowed to individually control delays of a rise side and a fall side of a signal;
    a control circuit configured to implement control so that a rise-side delay and a fall-side delay by the variable delay circuit are kept at the first delay specifying value of the first register and the second delay specifying value of the second register, respectively;
    a third register configured to hold a delay target value; and
    a digitally-controlled second variable delay circuit,
    wherein the control circuit is configured to subject a reference signal and the delay target value of the third register to an arithmetic operation, and supply the second variable delay circuit with a result of the arithmetic operation as a delay control value.

2. The digital DLL circuit according to claim 1, wherein the control circuit calculates delay control values of a rise side and a fall side of a signal for the variable delay circuit based on a reference signal and the first and second delay specifying values, and the control circuit supplies the calculated delay control values to the variable delay circuit.

3. The digital DLL circuit according to claim 1, wherein a delayed output from the second variable delay circuit is supplied as an input to the digitally-controlled variable delay circuit.

* * * * *